United States Patent
Perez

[11] Patent Number: 6,069,496
[45] Date of Patent: May 30, 2000

[54] CMOS CIRCUIT TECHNIQUE FOR IMPROVED SWITCHING SPEED OF SINGLE-ENDED AND DIFFERENTIAL DYNAMIC LOGIC

[75] Inventor: Paul L. Perez, Fort Collins, Colo.

[73] Assignee: Hewlett-Packard Company, Palo Alto, Calif.

[21] Appl. No.: 09/207,303

[22] Filed: Dec. 8, 1998

Related U.S. Application Data

[62] Division of application No. 08/658,920, May 31, 1996.

[51] Int. Cl.[7] .................................................. H03K 19/096
[52] U.S. Cl. ................................................ 326/98; 326/17
[58] Field of Search .................................. 326/93, 95, 98, 326/83, 112, 119, 121, 17

[56] References Cited

U.S. PATENT DOCUMENTS

| | | | |
|---|---|---|---|
| 4,488,066 | 12/1984 | Shoji | 326/98 |
| 4,577,124 | 3/1986 | Koike | 326/121 |
| 5,612,638 | 3/1997 | Lev | 326/98 |
| 5,818,264 | 10/1998 | Ciraula et al. | 326/98 |
| 5,841,300 | 11/1998 | Murabayashi et al. | 326/98 |

FOREIGN PATENT DOCUMENTS 2-277315  11/1990  Japan .

*Primary Examiner*—Jon Santamauro

[57] ABSTRACT

A method and apparatus for improving the forward path switching speed of a complementary CMOS inverter is presented. A large P-type to N-type FET ratio is used to tune the inverter trigger point to the falling edge of the input signal to the inverter. The high P-type to N-type ratio is made feasible by adding a precharge assist pull-down transistor in parallel on the output node of the inverter.

6 Claims, 11 Drawing Sheets

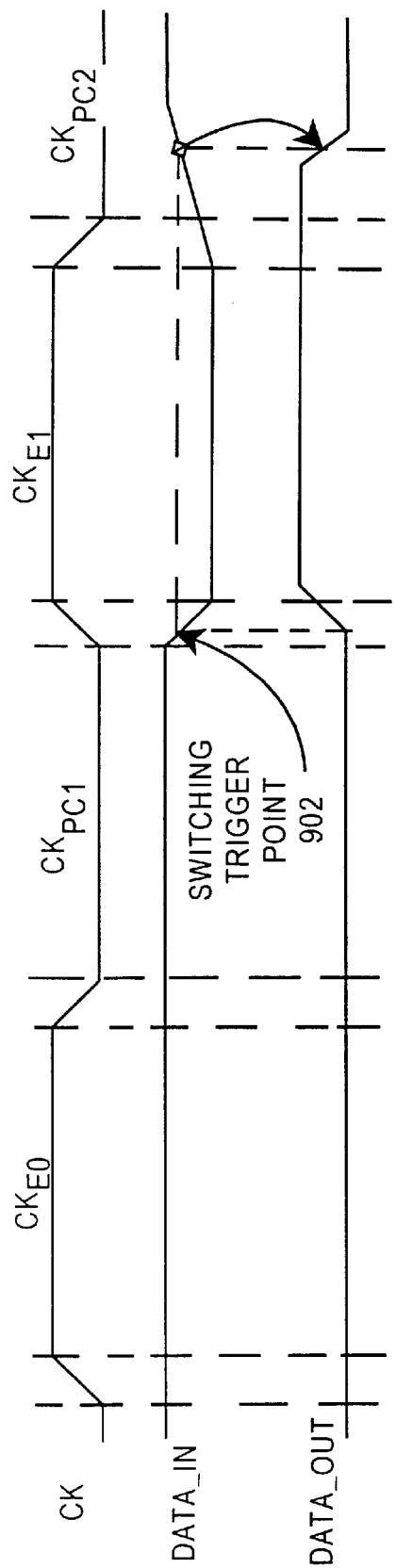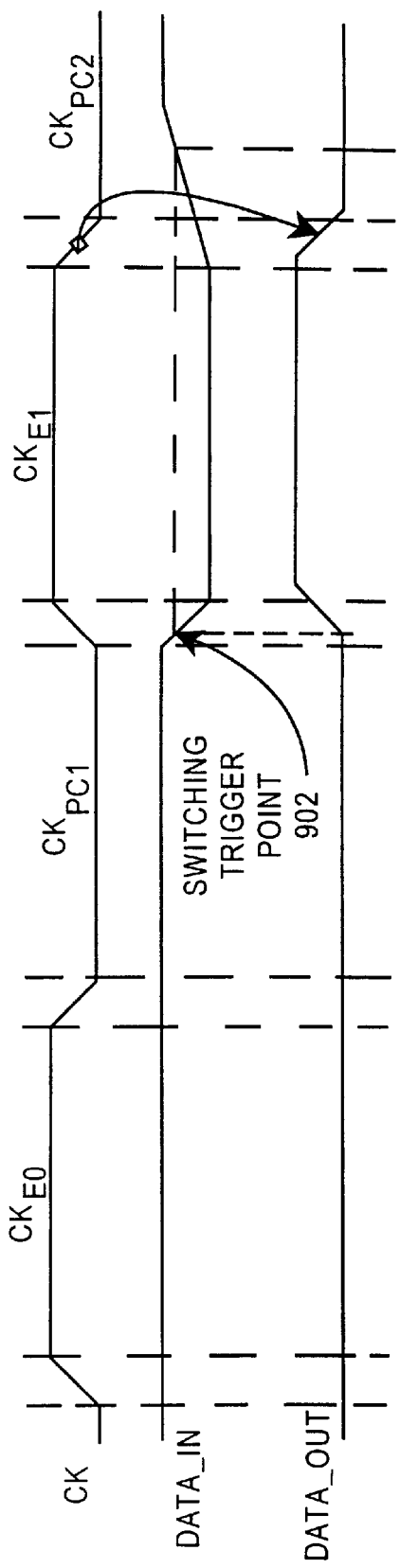

CMOS CIRCUIT TECHNIQUE FOR IMPROVED SWITCHING SPEED OF SINGLE-ENDED AND DIFFERENTIAL DYNAMIC LOGIC

RELATED APPLICATION

The present patent application is a divisional of U.S. application having Ser. No. 08/658,920 filed on May 31, 1996 entitled EVALUATION PHASE EXPANSION FOR DYNAMIC LOGIC CIRCUITS, which is incorporated herein by reference.

FIELD OF THE INVENTION

The present invention relates generally to CMOS integrated circuits, and more particularly, to CMOS circuit techniques for increasing both signal frequency and noise immunity for single-ended and differential dynamic logic.

BACKGROUND OF THE INVENTION

Dynamic logic gates are widely used in the design of logic circuits which require high performance and minimal size. Dynamic logic gates are much faster than static logic gates, but suffer from increased noise and susceptibility from fabrication process variation. Essentially, a dynamic logic gate is a circuit which requires a periodic electrical pre-charge, or refresh, such as with a dynamic random access memory (DRAM), in order to maintain and properly perform its intended logic function. Once the electrical pre-charge on the dynamic logic gate has been discharged, the dynamic logic gate can perform no other logic functions until subsequently precharged.

As computer systems have become increasingly faster and substantially smaller in size, techniques have been developed to improve the performance of dynamic logic.

One speed improvement technique is known as a "pipeline" model. A pipelined system utilizes a plurality of dynamic logic circuits arranged in a series of pipeline stages. Each pipeline stage represents the amount of work that can be performed in one clock (i.e., pre-charge) cycle. A pipeline typically utilizes a dual-phase clocking scheme, which is generally implemented using a pair of differential symmetric clocks generated by a centralized clocking circuit. Alternating pipeline stages receive the differential clock signals, CK1 and CK2. Thus, while a given pipeline stage performs an operation during its CK1 enable phase, the immediately subsequent pipeline stage, which depends on the output of the given pipeline stage, waits during its CK2 disable cycle. Then, when CK1 enters the disable cycle, CK2 enters the enable cycle, and the immediately subsequent pipeline stage performs an operation. Pipelining allows operational cycles to be overlapped, and is thus frequently used to increase throughput.

The use of dynamic logic in a pipeline system, however, is problematic. Clock asymmetry results from the use of a dual-phase clocking scheme used in alternating stages of the pipeline to hide the precharge during the "off duty" clock time of a pipeline stage. FIG. 1 graphically illustrates a possible two clock system which may be employed with a pipeline system. In the hypothetical scenario, odd numbered logic stages of N logic stages are clocked by a clock CK1, and even numbered logic stages are clocked by a clock CK2. Clocks CK1 and CK2 are intended by design to switch simultaneously, to be ideally alternating (180 degrees out of phase), and to have a 50 percent duty cycle with respect to one clock state ($t_{period}$) of the computer system's clock. However, because of unavoidable clock asymmetry, an "advantaged phase" ($t_1$') and a "disadvantaged phase" ($t_2$') will arise in reality, as comparatively shown in FIG. 1.

Generally, clock asymmetry results from inherent physical inequities in the manufacture of clock generation circuits. A precise time allocation (duty cycle) to the individual pipeline stages can never be achieved. A precise allocation or clocking of time to insure that each pipeline stage of the pipeline has an identical duty cycle is important because it tremendously affects the useful bandwidth of the pipeline, which will be limited to the period of the disadvantaged phase. In other words, the speed of the pipeline is less than optimal because valuable time is wasted in the pipeline stages (either even or odd) operating in the advantaged phase. More time is accorded to the pipeline stages corresponding with the advantaged phase than is necessary for complete operation of the pipeline stages.

Techniques have been developed to compensate for clock asymmetry. U.S. Pat. No. 5,392,423 to Yetter ("Universal Pipeline Latch for Mousetrap Logic Circuits") describes a technique called "phase stealing" whereby pipeline stages (odd or even) which operate in the disadvantaged phase effectively "steal" time from pipeline stages (even or odd) which operate in the advantaged phase. The technique involves the use of a pipeline latch which acts as an edge-triggered latch. The pipeline latch is placed before each pipeline stage, wherein each pipeline stage involves the use of vector logic and mousetrap logic gates. Briefly, vector logic involves the use of a plurality of signals for each data line, permitting more than two valid logic states (i.e., more than the conventional binary "0" and "1") and having one invalid logic state. A mousetrap logic gate comprises an arming mechanism, a functional logic block, and an inverting output buffer. The definition of an invalid state in vector logic allows the functional logic block to accept late inputs. In operation, pre-charging takes place during the pre-charge clock phase. Then, if the vector inputs remain in the invalid state throughout the entire evaluate phase and into the next pre-charge phase, then the pipeline latch at the input of the pipeline stage behaves as an edge-triggered latch for the duration of the pre-charge phase. In other words, a late arriving valid input state will be transferred immediately to the pipeline stage and processed by the pipeline stage. Thus, the pipeline latch allows the vector inputs to be self-timed and phase-stealing from the advantaged phase to be feasible.

The phase-stealing techniques described in U.S. Pat. No. 5,392,423 to Yetter are directed toward taking advantage of clock phase asymmetry in logically balanced alternating pipeline stages. In other words, phase-stealing techniques using a pipeline latch assume balanced clock phases and that the number of logic stages in any two alternating pipeline stages are approximately equal. However, many applications which utilize pipeline techniques require an imbalanced number of logic stages between two alternating pipeline stages. For example, two typical alternating pipeline stages may each require four levels of logic. Because the alternating pipeline stages are balanced in number of logic stages, the pipeline latch phase-stealing technique may be utilized to immunize against phase length asymmetry due to process variations in the actual physical implementation. If, on the other hand, the circuit design calls for six logic stages in one alternating pipeline stage and two logic stages in the other alternating pipeline stage, the pipeline stages are logically imbalanced. With the pipeline latch phase-stealing technique described above, the clock phase would have to be long enough to support the pipeline stage having the greatest number of logic stages, i.e., six levels of logic in this example, resulting in idle time in the alternating pipeline stage having the least number of logic stages, i.e., two levels of logic in this example. A method is needed for artificially inducing clock phase asymmetry to conform to logic asymmetry in alternating pipeline phases.

Another problem suffered by dynamic logic circuits in general, and in the mousetrap logic gates used in the pipeline techniques described above, is the limitation on switching speed caused by inverting output buffer precharge times. One performance improvement technique used to overcome the switching speed problem in inverting output buffers of dynamic logic circuits involves tuning the switching trigger point of a complementary CMOS inverter to the falling input in the forward logic path. This is accomplished with a large ratio of PMOS size to NMOS size (P:N) in the CMOS inverter. Essentially, an imbalanced P:N ratio biases the switching trigger point in one direction or the other. Thus, where the P:N ratio is large (i.e., greater than 1), the complementary CMOS inverter switches more quickly when the inverter input is falling, and more slowly when the inverter input is rising. This standard tuning technique improves the speed of the forward path, but practical considerations such as the required pre-charge time during the off-phase limit the maximum P:N ratio to approximately 4:1. In other words, because the complementary CMOS inverter is tuned to the forward path, the time required to reach the switching trigger point during the pre-charge phase increases. However, the maximum allowable pre-charge time is the time length of the off-phase, and thus the switching trigger point may only be increased to a certain cutoff point without resulting in performance degradation due to not-fully-charged circuit components.

Another problem suffered by dynamic logic circuits is signal degradation on output control lines. This may be the result of a source-destination ground differential. Even where there is a strong drive to ground for control lines that must remain low, a long metal route can induce IR drops. Further, there may be poor power-to-ground strapping between the source and destination, resulting in different source/destination ground potentials. This can affect pass-gate and dynamic logic which may trigger on transistor threshold voltage $V_T$ levels of under 1 volt.

Finally, dynamic logic circuits which have mutually exclusive output control lines, such as differential or vector logic outputs (where only 1 of N lines is high at any given time), often suffer from noise coupling problems and results in output signal degradation.

Accordingly, it would be desirable to provide techniques for enhancing speed in dynamic logic while also improving signal noise immunity and insensitivity to duty cycle variations in the clocks. Specifically, it would be desirable to maximize the effect of phase-stealing in a pipelined system to overcome the logic asymmetry problem in alternating stages of a pipeline latch. In addition, it would be desirable to increase the switching speed of output inverters by increasing the P:N transistor ratio of the CMOS inverter, while removing the dependency of the switching speed from the amount of required pre-charge time in the pre-charge phase. Furthermore, it would be desirable to improve signal quality on output control lines by suppressing high-transitioning pulses on low-driven control lines and also referencing the low control line level to the local ground to immunize pass-gate logic. Finally, it would be desirable to improve output signal quality by preventing coupling between mutually exclusive output control lines.

SUMMARY OF THE INVENTION

In accordance with the present invention, various techniques are described for increasing signal frequency and enhancing signal degradation immunity. In one technique, the present invention provides a clocking scheme for maximizing the evaluation phase time during which a dynamic logic circuit can evaluate the logical function of the circuit. In accordance with the present invention, the dynamic logic circuit includes a plurality of logic stages responsive to an "early" clock signal and a plurality of logic stages responsive to a "late" clock signal. In the preferred embodiment, the "late" clock signal is a delayed version of the "early" clock signal. The use of an early clock signal and a late clock signal provides an expanded evaluation phase by allowing the evaluation phase of dynamic logic stages clocked by the late clock signal to overlap into the pre-charge phase of dynamic logic stages clocked by the early clock signal. This clocking scheme provides a technique for artificially inducing clock phase asymmetry to conform to logic asymmetry in alternating pipeline phases.

Another speed improvement technique of the present invention provides increased forward path switching speed of an output complementary CMOS inverter. In this technique, a large P:N FET ratio (approximately 12:1) is used to tune the inverter trigger point to the falling edge of an input signal. The high P:N ratio is made feasible by adding, in parallel, a precharge assist pulldown transistor on the output node. The pre-charge assist FET removes the switching speed limitation dependency from the amount of required pre-charge time in the pre-charge phase. The pre-charge assist FET presents only a small load to the inverter output, yet considerably speeds up the precharge time for high-fanout or high-load dynamic inverter outputs. The precharge assist FET is turned on by a precharge clock derived (i.e., complemented) from the evaluate clock.

An improved noise immunity technique of the present invention includes a dynamic line terminator circuit for an output control line of a dynamic logic circuit.

Another improved noise immunity technique of the present invention includes a noise-suppression circuit for improving noise immunity between mutually exclusive control lines due to cross-coupling.

BRIEF DESCRIPTION OF THE DRAWINGS

FIG. 9(a) is a timing diagram of the various signals of a typical complementary CMOS inverter which does not include a pre-charge assist FET as in the present invention.

FIG. 9(b) is a timing diagram of the various signals of the complementary CMOS inverter which does include the pre-charge assist FET in accordance with the present invention.

DETAILED DESCRIPTION OF THE INVENTION

Figure 1:
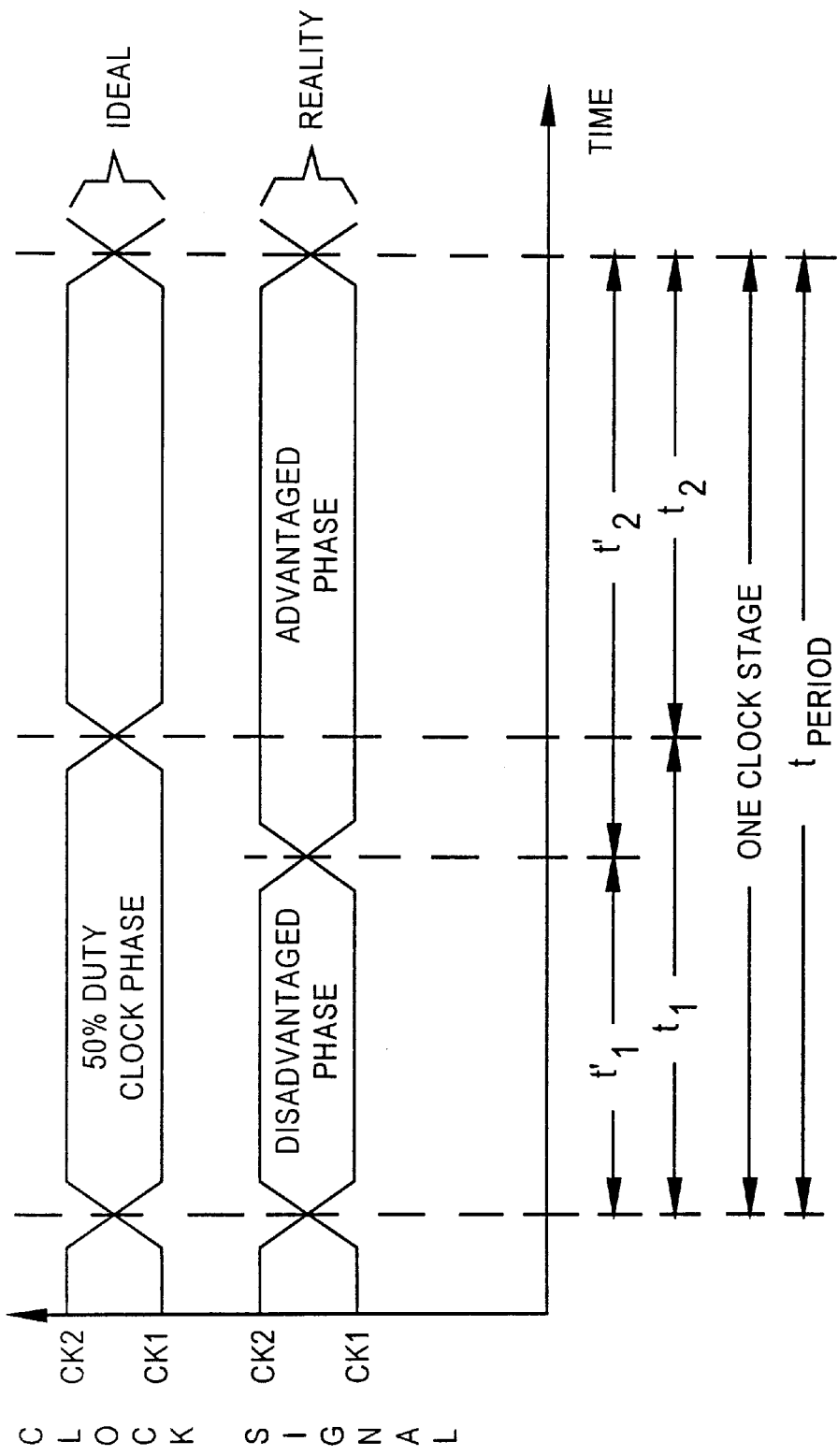
FIG. 1 is a timing diagram of a dual-phase clock signal used in a pipeline system which illustrates the "clock asymmetry" problem.
Figure 2:
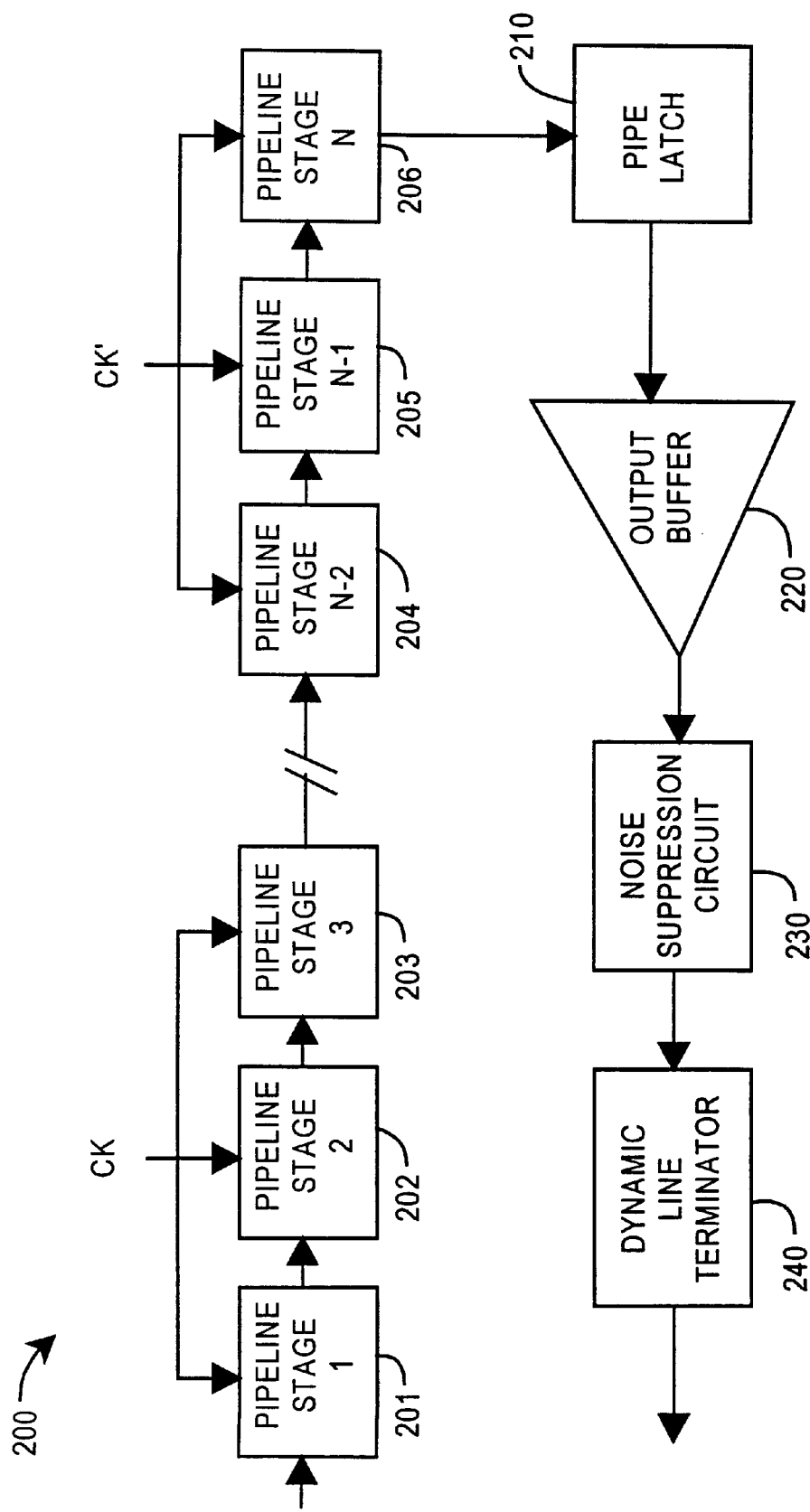
FIG. 2 is a high level block diagram of a dynamic logic pipeline system encompassing each of the CMOS circuit enhancement techniques of the present invention.

There is shown in FIG. 2 a high level block diagram of a dynamic logic circuit 200 encompassing each of the CMOS circuit enhancement techniques of the present invention. As shown in FIG. 2, the dynamic logic circuit 200 utilizes pipelining techniques to improve performance. As seen in FIG. 2, the dynamic logic circuit 200 includes a plurality of logic stages 201–206, each of which receives either an early clock signal CK or a late clock signal CK'. Typically, a dynamic logic circuit will end with a latch 210, which is triggered upon receipt of valid input and which holds the valid input at its output until reset. According to the present invention, the late clock signal CK' is a delayed version of the early clock signal CK. The plurality of logic stages 201–203 which receive the early clock signal CK perform a logical evaluation during an early evaluate phase $CK_E$, and the plurality of logic stages 204–206 which receive the late clock signal CK' perform a logical evaluation during a late evaluate phase $CK'_E$. The structure of the dynamic logic circuit 200, wherein each pipeline stage is clocked by either an early clock signal CK or a late clock signal CK', illustrates an evaluation phase expansion technique of the present invention, which essentially maximizes the duration of the evaluation phase of a dynamic logic clock signal. As also shown in FIG. 2, a high-speed dynamic CMOS output buffer 220 receives the output of the latch 210. The output buffer 220 implemented in accordance with the present invention provides significantly increased switching speed which is independent of the required pre-charge time. Also included in the dynamic logic circuit 200 of the present invention is a noise-suppression circuit 230 for improving noise immunity due to cross-coupling in a dynamic logic circuit which outputs any two mutually exclusive output lines. The present invention also includes a dynamic line terminator circuit 240 for improving noise immunity of an output control line of the dynamic logic circuit 200.

Each of the various aspects of the present invention are analyzed in more detail below, beginning with speed enhancement techniques and then turning to improved noise immunity techniques.

With reference to FIG. 2, one speed enhancement technique of the present invention is an evaluation phase expansion technique for maximizing the evaluation phase time of a dynamic logic circuit clock signal. As shown in FIG. 2, the dynamic logic circuit 200 includes a plurality of logic stages 201–206, each of which receives either an early clock signal CK or a late clock signal CK'. Each logic stage 201–203 receiving an early clock signal CK, hereinafter "early" logic stage, comprises an "early" logic circuit implementing a logical function. The early logic circuit is pre-charged during an early pre-charge phase $CK_{PC}$, and is evaluated during an early evaluate phase $CK_E$. Each logic stage receiving a late clock signal CK', hereinafter "late" logic stage, comprises a "late" logic circuit implementing a logical function. The late logic circuit is pre-charged during a late pre-charge phase $CK'_{PC}$, and is evaluated during a late evaluate phase $CK'_E$.

Figure 3:
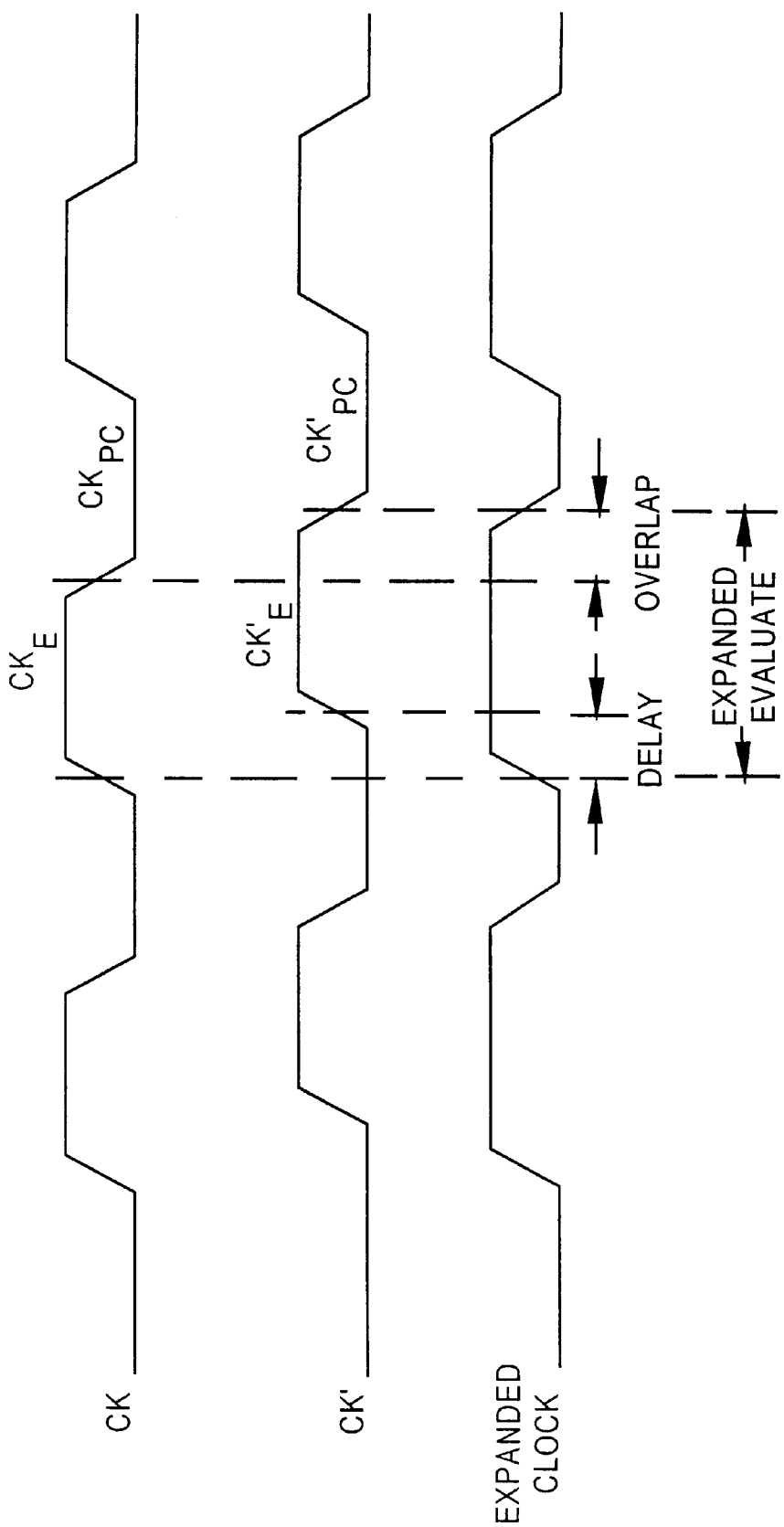
FIG. 3 is a timing diagram of the relationship between the early clock signal CK and the late clock signal CK' used in the system of FIG. 2.

FIG. 3 is a timing diagram of the relationship between the early clock signal CK and the late clock signal CK'. As shown in FIG. 3, the late clock signal CK' is a delayed version of the early clock signal CK. Preferably the late clock signal CK' and the early clock signal CK have identical evaluate phase times and identical pre-charge phase times. Thus, the late clock signal CK' has a rising evaluate phase $CK'_E$ edge which rises during the early evaluate phase $CK_E$ and has a falling evaluate phase $CK'_E$ edge which falls during the early pre-charge phase $CK_{PC}$. In other words, the late evaluate phase $CK'_E$ overlaps the early pre-charge phase $CK_{PC}$. The early logic stages 201–203 can evaluate during the early evaluate phase $CK_E$ and start pre-charging during the late evaluate phase $CK'_E$, while the late logic stages 204–206 can evaluate during the late evaluate stage $CK'_E$ while the early evaluate stages are already pre-charging in preparation for the next evaluate phase. This "phase-stealing" relies on overlaps between early and late clock signals, and allows the length of the evaluate phase to be maximized, as shown in FIG. 3 by the expanded evaluate phase. The delay between the early clock signal CK and the late clock signal CK' can be adjusted to be S/2, where S is the number of logic stages that evaluate in the early evaluate phase. The phase-stealing technique of the present invention allows logic stages to accept late inputs which may arrive late in their evaluate phase, or even after their respective evaluate phase may have ended.

Figure 4:
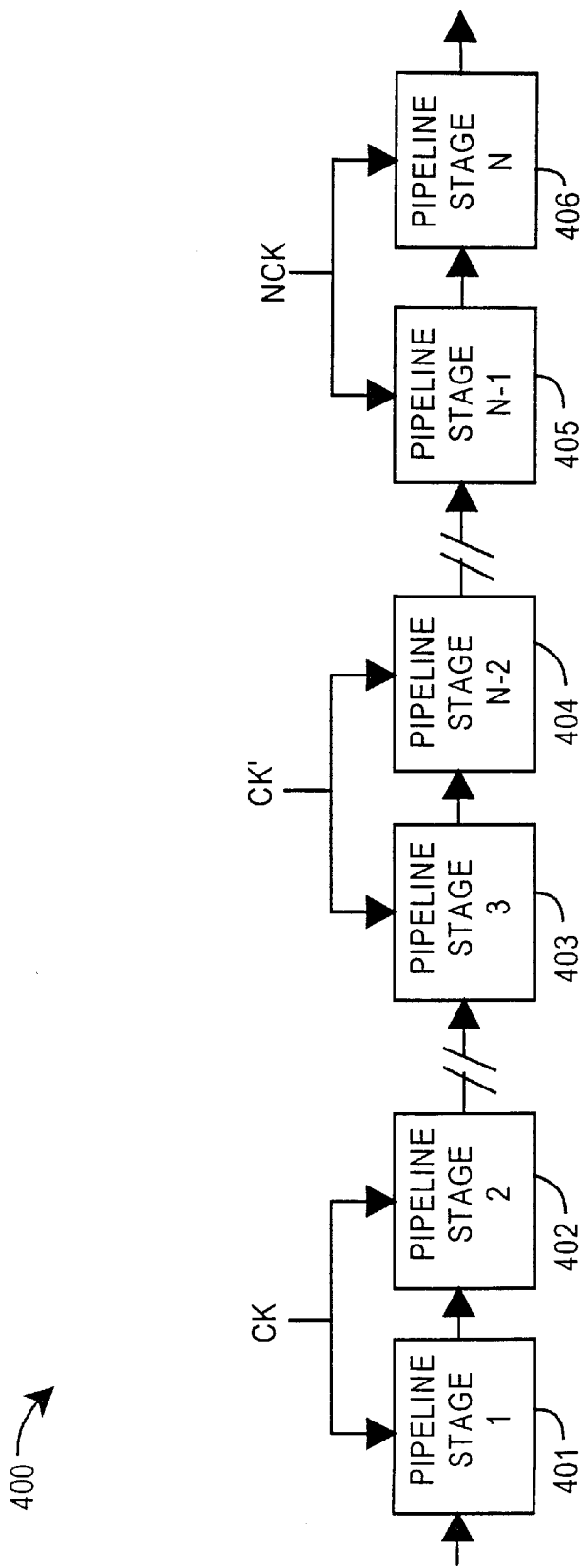
FIG. 4 is a high level block diagram of a dual-phase dynamic logic pipeline system incorporating the principles of the phase-expansion technique of the present invention.

FIG. 4 illustrates a more sophisticated dynamic logic circuit 400 which utilizes a dual-phase (differential) clock CK, NCK for implementing pipelining techniques to overlap logic evaluation of different logic stages. Evaluation phase expansion techniques are even more useful with a differential clock pipelined system. As shown in FIG. 4, the dynamic logic circuit 400 includes a plurality of logic stages 401–406, each of which receives either an early clock signal CK, a late clock signal CK', or a differential clock signal NCK. Each logic stage 401–402 receiving an early clock signal CK, hereinafter "early" logic stage, comprises an "early" logic circuit implementing a logical function. The early logic circuit is pre-charged during an early pre-charge phase $CK_{PC}$, and is evaluated during an early evaluate phase $CK_E$. Each logic stage 403–404 receiving a late clock signal CK', hereinafter "late" logic stage, comprises a "late" logic circuit implementing a logical function. The late logic circuit is pre-charged during a late pre-charge phase $CK'_{PC}$, and is evaluated during a late evaluate phase $CK'_E$. Each logic stage 405–406 receiving a differential clock signal NCK, hereinafter succeeding logic stage, comprises a logic circuit implementing a logical function. The succeeding logic stage is pre-charged during a succeeding pre-charge phase $NCK_{PC}$, and is evaluated during a succeeding evaluate phase $NCK_E$.

Figure 5:
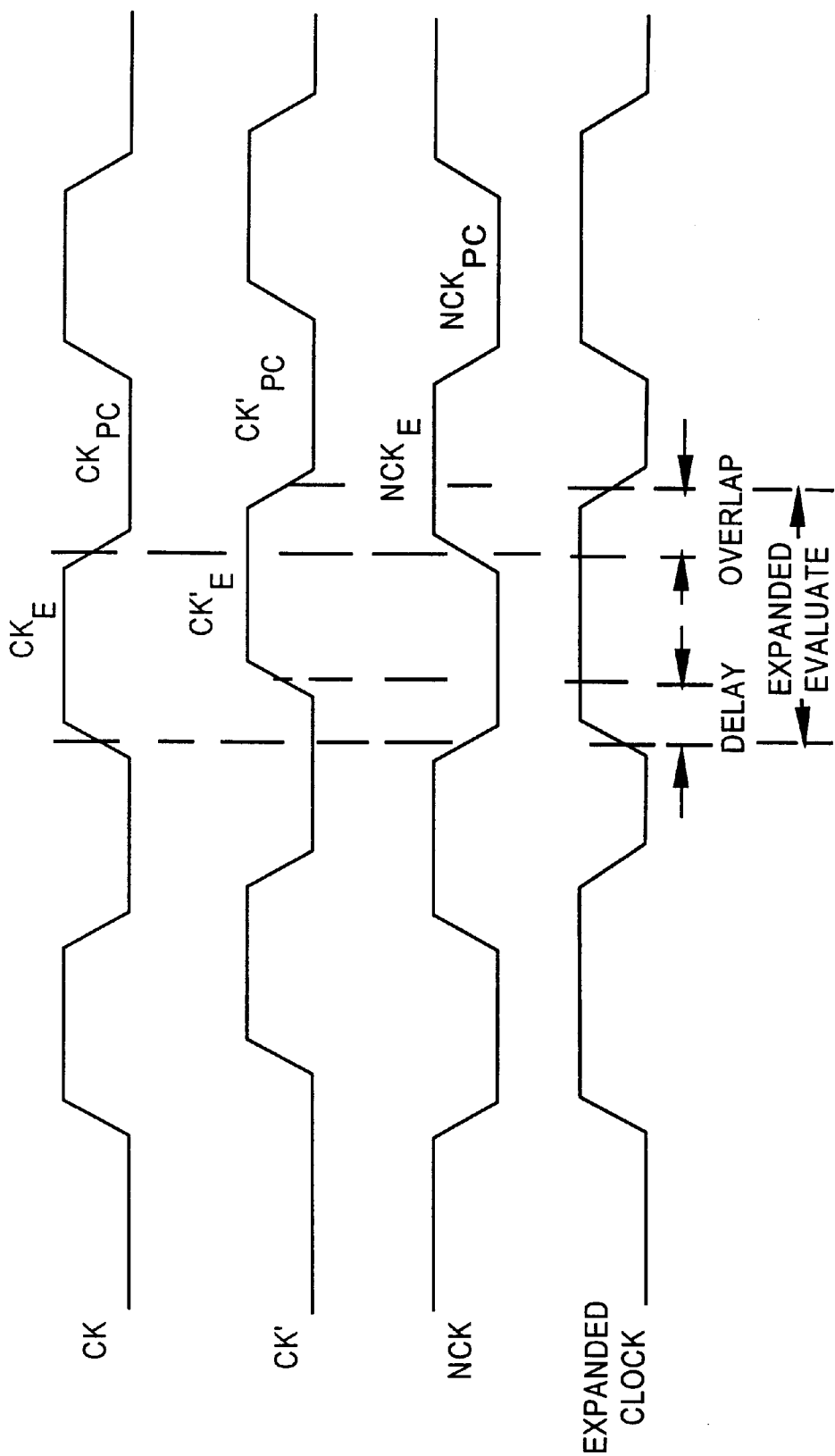
FIG. 5 is timing diagram of the clock signals shown in FIG. 4.

FIG. 5 is a timing diagram of the clock signals of FIG. 4 presented for clearer understanding of the operation of evaluation phase expansion technique of the present invention. As shown in FIG. 5, early clock signal CK produces a preceding evaluate phase, and differential clock signal NCK produces the succeeding evaluate phase. As seen in FIG. 5, the differential clock signal NCK is the symmetric complement of early clock signal CK. Furthermore, late clock signal CK' is a delayed version of early clock signal CK. The falling edge of late clock signal CK' overlaps into the succeeding evaluate phase $NCK_E$. The delay between the early clock signal CK and the late clock signal CK' can be adjusted to S/2, where S is the number of logic stages that evaluate in early evaluate phase $CK_E$. Thus, the early logic stages 401–402 can evaluate during the early evaluate phase $CK_E$ and start precharging during late evaluate phase $CK'_E$. The late logic stages 403–404 evaluate during the late evaluate phase $CK_L$, overlapping with the succeeding evaluate phase $NCK_E$ for maximal overlap and phase-stealing. Thus, FIG. 5 illustrates how the evaluation phase expansion technique of the present invention also maximizes pipeline speed, and therefore operating frequency.

Figure 6:
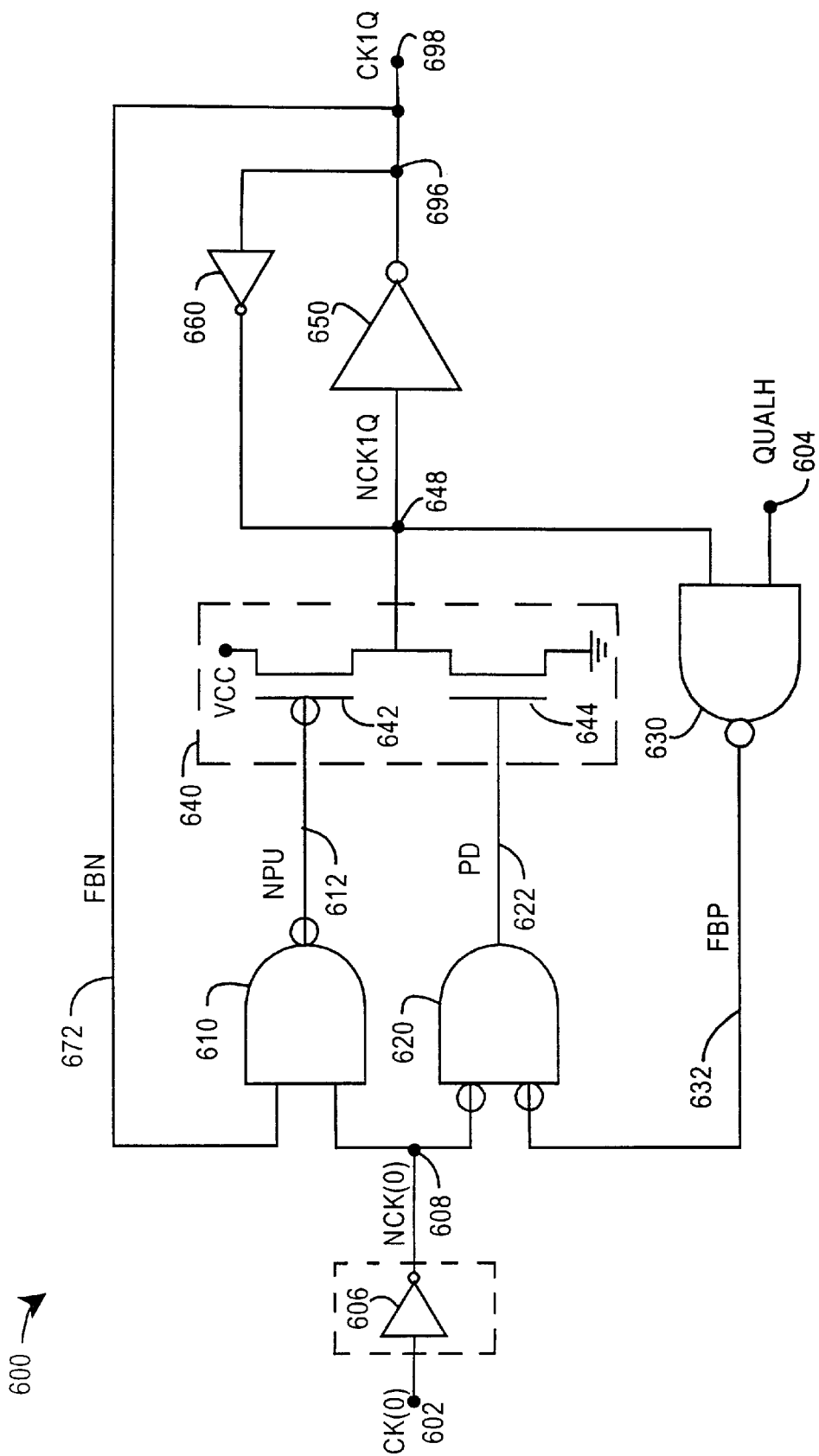
FIG. 6 is a schematic diagram of a universal CMOS clock buffer circuit used to implement the preferred embodiment for each of the early clock signal CK and the late clock signal CK' shown in FIGS. 2 and 4, and the differential clock signal NCK shown in FIG. 4.

In the preferred embodiment, the early clock signal CK, differential clock signal NCK, and late clock signal CK' are generated using universal CMOS clock buffer circuits of the type described in "Local CMOS Clock Buffer Circuits" to Samuel Naffziger, copending application Ser. No. 08/609,306, filed Mar. 1, 1996. FIG. 6 illustrates the universal CMOS clock buffer circuit used to implement the preferred embodiment for each of the early clock signal CK, the late clock signal CK', and the differential clock signal NCK. As shown in FIG. 6, the universal CMOS clock buffer 600 receives a system clock signal CK(0) 602 as a first input. A first inverter 606 inverts the system clock signal CK(0) to produce inverted system clock signal NCK(0) 608. A first 2-input NAND gate 610 receives the inverted system clock signal NCK(0) at a first input, and the output signal CK1Q of the universal CMOS clock buffer circuit 600 at a second input. The first 2-input NAND gate 610 produces an inverted pullup signal NPU 612 at its output. As also shown in FIG. 6, the universal CMOS clock buffer 600 receives a qualifier signal QUALH 604 as a second input. A second 2-input NAND gate 604 receives the qualifier signal QUALH 604 at a first input, and the inverted output signal NCK1Q at a second input. The second 2-input NAND gate 630 produces a feedback signal FBP 632. A 2-input NOR gate receives the feedback signal FBP 632 at a first input, and the inverted system clock signal NCK(0) 608 at a second input. The 2-input NOR gate 620 produces a pulldown signal PD 622 at its output.

A push-pull circuit 640 receives the pullup signal NPU 612 and the pull-down signal PD 622. The push-pull circuit 640 comprises a push FET 642 coupled in drain-source relationship with a pull FET 644. The push FET 642 has a source coupled to a power supply VDD, a gate coupled to receive the inverted pullup signal NPU 612, and a drain coupled to both the source of the pull FET 644 and an inverted output node 648. The push FET 644 has a source coupled to both the drain of the push FET 642 and the inverted output node 648, a gate coupled to receive the pulldown signal PD 622, and a drain coupled to the chip ground. In the preferred embodiment, the push FET 642 is implemented using a PMOSFET and the pull FET 644 is implemented using an NMOSFET.

A second inverter 650 is coupled to receive the inverted output signal NCK1Q and to produce an output signal CK1Q 698. The second inverter 650 has a high gain and is matched to the specific capacitive load of the combined logic stages that it drives. A third feedback inverter 660 is coupled between the output node 696 and the inverted output node 648. The third feedback inverter 660 improves noise immunity and prevents a floating condition from occurring on the inverted output signal NCK1Q. Thus, the third feedback inverter 660 drives the inverted output node 648 whenever the inverted pullup signal NPU 612 is high and the pulldown signal PD 622 is low at the same time.

Generally, the universal CMOS clock buffer 600 operates as a 2-input AND gate, with the system clock signal CK(0) and the qualifier signal QUALH as inputs, to produce a local clock signal CK or CK'. In the preferred embodiment, the qualifier signal QUALH is tied high, and the early clock signal CK and the late clock signal CK' are delayed self-timed versions of the system clock signal CK(0). The amount of delay between the falling edges of the early clock signal CK and the late clock signal CK' is determined by the FET sizes used to implement the universal CMOS clock buffer. The differential clock signal NCK is generated using the same circuit, but without the initial inverter 606.

Figure 7:
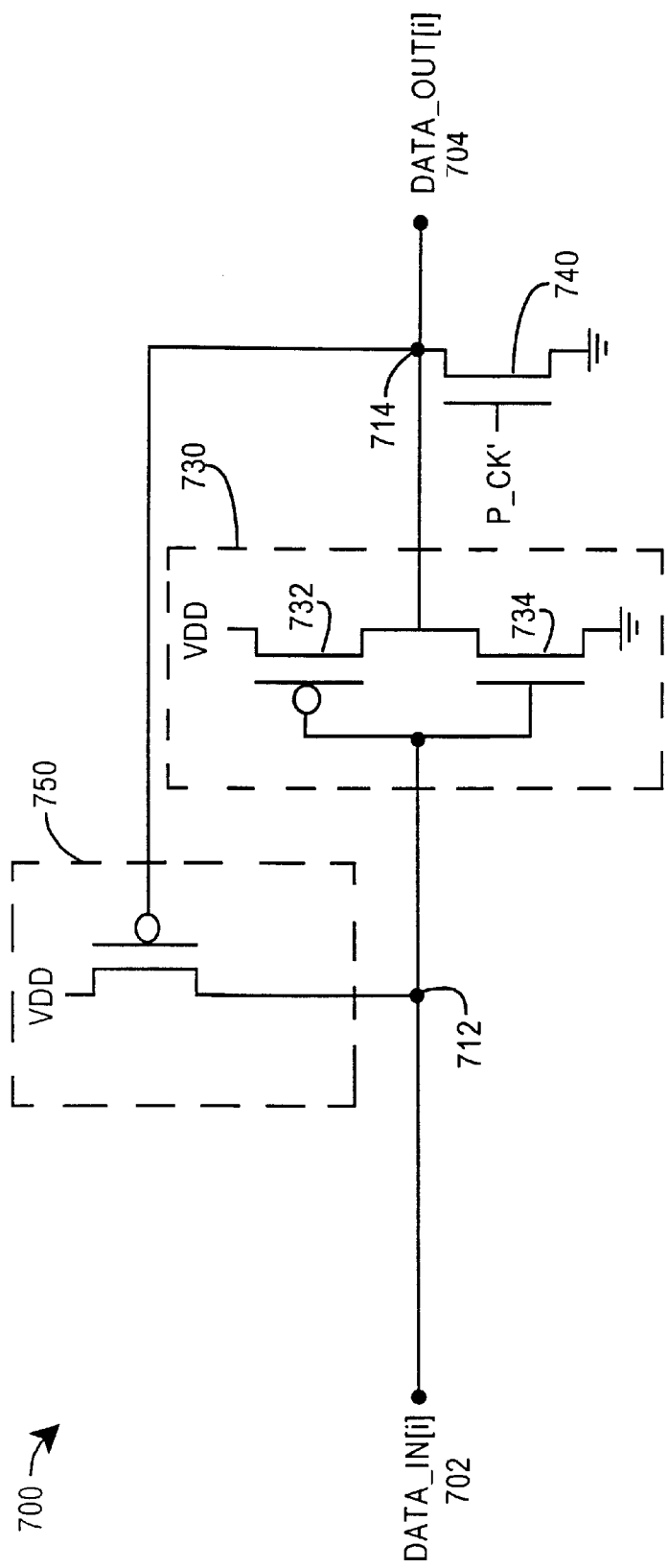
FIG. 7 is a schematic diagram of a high-speed dynamic complementary CMOS inverter in accordance with the present invention.

Another speed enhancement technique of the present invention is the use of appropriately placed high-speed dynamic complementary CMOS inverters, as shown generally at 700 in FIG. 7. Specifically, where high-speed switching in response to the falling edge of an inverter input signal in the forward path is desired, the high-speed complementary CMOS inverter 700 allows a greater P:N ratio than previously possible, thereby increasing the switching speed in the forward path and, at the same time, eliminating the dependency of the output signal switching time on the required pre-charge time.

As shown in FIG. 7, the high-speed dynamic complementary CMOS inverter 700 of the present invention includes a complementary CMOS inverter 730 responsive to an input signal DATA_IN[i] 702 at an input node 712. The high-speed dynamic complementary CMOS inverter 700 produces an inverted output signal DATA_OUT[i] 704 at an output node 714. The complementary CMOS inverter 730 includes a PFET 732 coupled in drain-source relationship with an NFET 734. In other words, the source of the PFET 732 is coupled to a power source VDD, the gate of the PFET 732 and the gate of the NFET 734 are coupled to the input node 712 to receive the input signal DATA_IN[i] 702, the drain of the PFET 732 and the source of the NFET 734 are coupled to the output node 714 for producing the output signal DATA_OUT[i] 704, and the drain of the NFET 734 is coupled to a circuit ground. Furthermore, the ratio of the sizes of the PFET to the NFET, P:N, is much greater than 1. In the preferred embodiment, the ratio is approximately 12:1, producing an inverter switching trigger point tuned to a falling edge of the input signal DATA_IN[i] 702. The high-speed dynamic complementary CMOS inverter 700 also includes a pre-charge assist NFET 740. The pre-charge assist NFET 740 has a source coupled to the output node 714, a drain coupled to the circuit ground, and a gate coupled to a complemented pre-charge clock signal. When the high-speed dynamic complementary CMOS inverter 700 is tuned to the falling edge of the input signal 702, the output signal DATA_OUT[i] 704 switches high as soon as the level of the input signal DATA_IN[i] 702 falls past the inverter trigger point. Then, as soon as the evaluate phase of the clock signal is entered, the complemented pre-charge clock signal goes high, which turns on the pre-charge assist FET 740, and quickly pulls the output signal DATA_OUT[i] 704 low (i.e., to ground).

Figure 8:
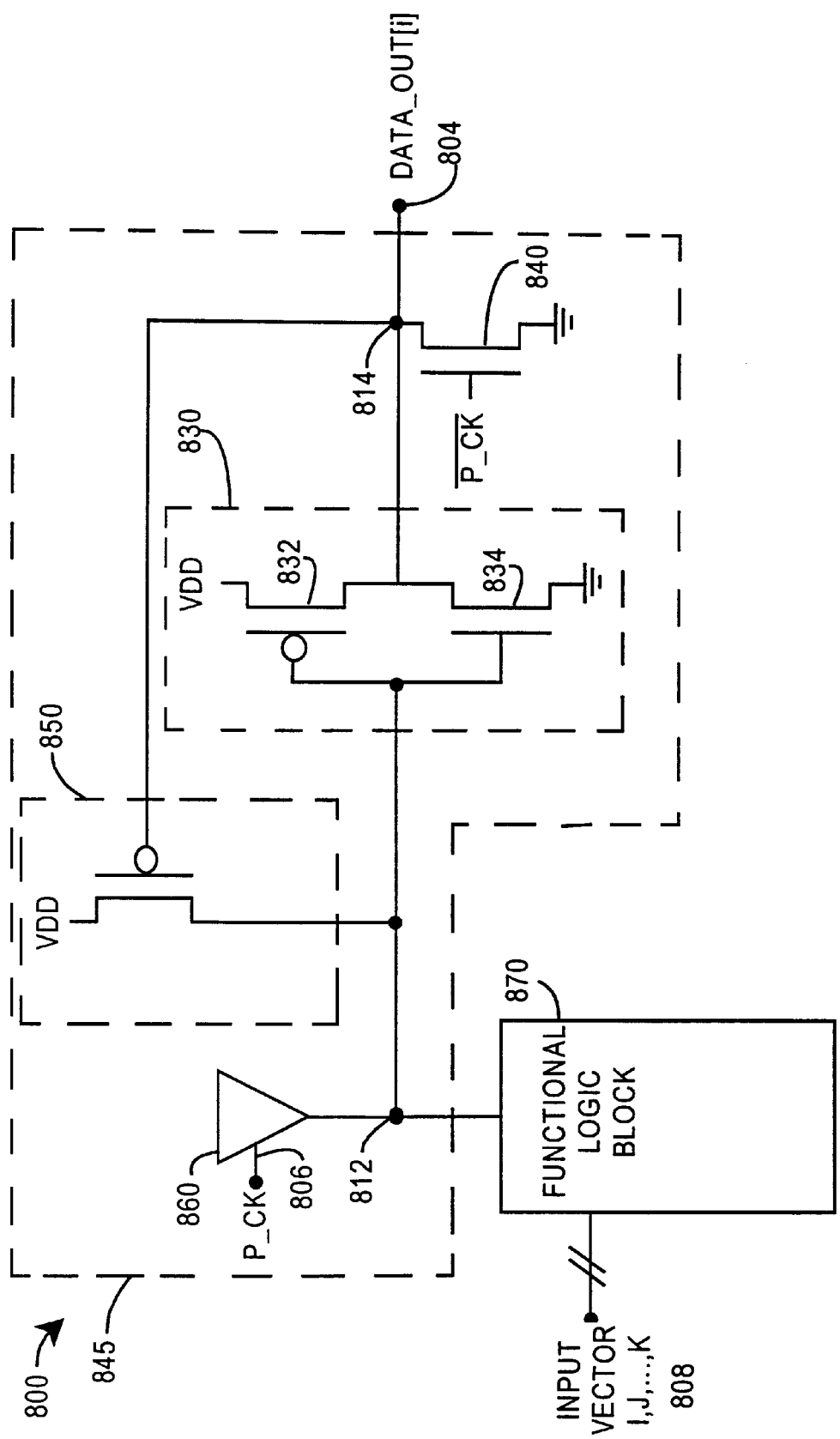
FIG. 8 is a schematic diagram of a typical application of a high-speed dynamic complementary CMOS inverter of the present invention.

FIG. 8 is a schematic diagram of a typical application of the high-speed dynamic complementary CMOS inverter of the present invention. As shown in FIG. 8, a high-speed dynamic complementary CMOS inverter 845, in accordance with the principles discussed with respect to FIG. 7, is used in a dynamic logic circuit stage 800. Potentially, the dynamic logic circuit stage 800 will be one of several similarly structured dynamic logic circuit stages which are connected in series and/or parallel to form a larger dynamic logic circuit. The dynamic logic circuit stage 800 includes an arming mechanism 860, a functional logic block 870, and the high-speed dynamic complementary CMOS inverter 845.

The arming mechanism 860 is a pre-charging means for arming and resetting the dynamic logic circuit stage 800. The arming mechanism 860 essentially serves as a switch to thereby selectively impose a voltage $V_O$ defining a logic state on a line 812 upon excitation by a pre-charge clock signal P_CK (high or low) on line 806. As known in the art, any type of switching element or buffer for selectively applying voltage based upon a clock signal can be used. In the preferred embodiment, a PFET is used to implement the arming mechanism 860. The PFET has a source coupled to a power source VDD, a drain coupled to line 812, and a gate coupled to receive the pre-charge clock P_CK.

The functional logic block 870 is designed to perform a logic function on conditionally low-go-high vector inputs I, J, . . . , K. The functional logic block 870 may vary depending upon the purpose of the dynamic logic circuit stage 800. In the preferred embodiment, the functional logic block 870 is essentially a combination of NMOS FETs in a pull-down network implementing a given logic function.

The high-speed dynamic complementary CMOS inverter 845 primarily serves as an inverter because in order to provide complete logic functionality in the dynamic logic circuit stage 800, it is necessary to have an inversion function in the critical logic path. Moreover, the high-speed dynamic complementary CMOS inverter 845 provides gain to the signal residing on line 812 and provides isolation between other potential logic stages.

In operation, upon excitation by a pre-charge clock P_CK on the line 806, the arming mechanism 860 pulls up, or drives, the output 812 of the functional logic block 870 high. Concurrently, the arming mechanism 860 pulls the input at line 806 to the high-speed dynamic complementary CMOS inverter 845 to a logic high. Consequently, the output DATA_OUT[i] 804 on output line 814 is maintained at a logic low. The dynamic logic circuit stage 800 will remain in the armed predicament with the output DATA_OUT[i] 804 in a logic low state until being triggered by the functional logic block 870.

The functional logic block 870 is triggered upon receiving valid inputs to determine the correct state of the functional logic block output on line 812.

FIGS. 9(a) and 9(b) illustrate the impact of the pre-charge assist FET 740, 840 of the present invention. FIG. 9(a) is a timing diagram of the various signals of a typical complementary CMOS inverter which does not include the pre-charge assist FET 740, 840 according to the present invention. As shown in FIG. 9(a) by switching trigger point 902, the complementary CMOS inverter is tuned to increase the switching speed of the inverter to the falling edge of the input signal DATA_IN. During evaluation phase $CK_{E0}$, FIG. 9(a) shows that the input signal DATA_IN is high, so the output signal DATA_OUT is inverted low. During pre-charge phase $CK_{PC1}$, the output signal DATA_OUT is already low, so it is already in its invalid state. During evaluation phase $CK_{E1}$, however, the input signal DATA_IN falls low, and the output signal DATA_OUT goes high as soon as the input signal DATA_IN falls below the switching trigger point 902. Then, during the next precharge phase $CK_{PC2}$, the signal level of DATA_IN is slowly increased. When the signal level of DATA_IN reaches the switching trigger point 902, then DATA_OUT falls low to its invalid state (i.e., low). Since the switching trigger point 902 is biased to the falling edge of input signal DATA_IN, it takes longer for the input signal DATA_IN to pre-charge to the switching trigger point during the pre-charge phase. Therefore, it takes longer for the output signal DATA_OUT to switch to its invalid state during the pre-charge phase. Thus, as shown by FIG. 9(a), the time it takes for output signal DATA_OUT to switch to its invalid state during the pre-charge phase is dependent upon the amount of time it takes the pre-charge signal to ramp up to the switching trigger point. In prior art, this limits the attainable P:N ratio for forward path switching (i.e., switching during the evaluation phase) to approximately 4:1 because the output signal must go invalid (i.e., low) before the next evaluate phase.

The advantages of inserting the pre-charge assist FET 740 of the present invention is seen in FIG. 9(b). As shown in FIG. 9(b), the high-speed dynamic complementary CMOS inverter 700 of FIG. 7 is also tuned to the falling edge of the input signal DATA_IN with a large P:N ratio. During evaluation phase $CK_{E0}$, FIG. 9(b) shows that the input signal DATA_IN is high, so the output signal DATA_OUT is inverted low. During pre-charge phase $CK_{PC1}$, the output signal DATA_OUT is already low, so it is already in its invalid state. During evaluation phase $CK_{E1}$, however, the input signal DATA_IN falls low, and the output signal DATA_OUT goes high as soon as the input signal DATA_IN falls below the switching trigger point 902. Then, during the next precharge phase $CK_{PC2}$, the signal level of DATA_IN is slowly increased. However, as shown in FIG. 9(b), the output signal DATA_OUT switches to an invalid state (i.e., low) as soon as the pre-charge phase is entered because the pre-charge assist FET 740, 840 is turned on by the pre-charge clock (i.e., the complemented clock signal CK). When the pre-charge assist FET 740, 840 is turned on, the output signal DATA_OUT is quickly pulled to ground, as shown in FIG. 9(b). Thus, as shown by FIG. 9(b), the time it takes for output signal DATA_OUT to switch to its invalid state during the pre-charge phase is no longer dependent upon the amount of time it takes the pre-charge signal to ramp up to the switching trigger point. The present invention allows the P:N ratio to be greatly increased because the pre-charge assist FET 740, 840 removes the switching dependency of the output signal DATA_OUT during the pre-charge phase from the pre-charge time by placing it with the evaluate clock. As shown in FIG. 9(b), the output signal DATA_OUT switches to an invalid state (i.e., low) as soon as the pre-charge phase is entered.

Figure 10:
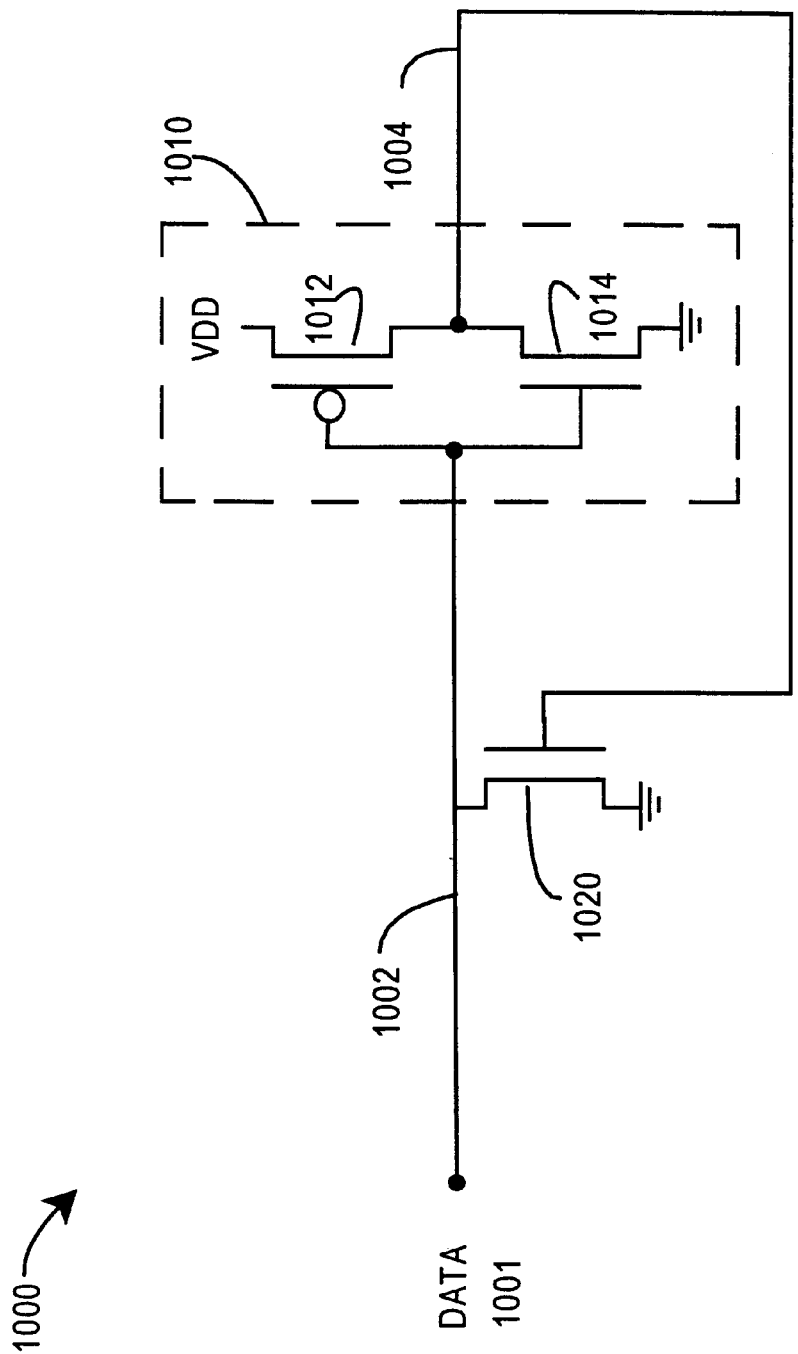
FIG. 10 is a schematic diagram of a dynamic line terminator circuit implemented according to the principles of the present invention for a signal which is conditionally low-go-high.

Turning now to the improved CMOS noise immunity techniques of the present invention, FIG. 10 shows a dynamic line terminator circuit 1000 for use on an output control line 1002 of a CMOS dynamic logic circuit. The dynamic line terminator circuit 1000 of the present invention improves noise immunity on the output control line 1002 of a CMOS integrated circuit. As shown in FIG. 10, the dynamic line terminator circuit 1000 includes a complementary CMOS inverter 1010 having an input coupled to the output control line 1002 and an output coupled to an inverter output line 1004. The complementary CMOS inverter 1010 comprises a PFET 1012 connected in drain-series relationship with an NFET 1014, such that the source of the PFET 1012 is coupled to a power source VDD, the gate of the PFET 1012 and the gate of the NFET 1014 are coupled to the output control line 1002 to receive a data signal DATA 1001, the drain of the PFET 1012 and the source of the NFET 1014 are coupled to the inverter output line 1004, and the drain of the NFET 1014 is coupled to a circuit ground. As also shown in FIG. 10, the dynamic line terminator circuit 1000 further includes a pulldown NFET 1020 having a drain coupled to the output control line 1002, a source coupled to the circuit ground, and a gate coupled to the inverter output line 1004.

The dynamic line terminator circuit 1000 shown in FIG. 10 actively suppresses high-going pulses on low control lines. In operation, the trip point of the complementary CMOS inverter 1010 (i.e., the sizes of FETs 1012 and 1014) are adjusted to a Vdd/2 trip point. Assume the data signal DATA 1001 on control line 1002 fires low-go-high, and at the end of the phase it precharges low. As the control line 1002 drops below Vdd/2, the inverter output line 1004 will transition low-go-high and turn on pull-down NFET 1020. Pull-down NFET 1020 is sized to be strong enough to help reference the low logic level on control line 1002 to local ground and to be easily overdriven by a large control line driver, such as 220, FIG. 2 or 800, FIG. 8, that generates data signal DATA 1001 without incurring speed delays. While data signal DATA 1001 on control line 1002 is low, any transient surges in voltage on the control line 1002 caused by noise, coupling or ground differential, will be dissipated through pull-down NFET 1020 (and also through transistors 1110 or 1120 or FIG. 11, if implemented, discussed hereinafter). The sizes of the transistors shown in FIG. 10 in the preferred embodiment were as follows:

| Transistor | Size |
|---|---|
| 1012 | 3.6 um |
| 1014 | 1.2 um |
| 1020 | 8.0 um |

With the above FET sizes, noise spikes were suppressed from 1.2 V down to 300 mV with less than 5% degradation in speed for the line. As a reference, typical threshold voltages $V_T$'s range from 900 mV to 1000 mV.

In addition to suppressing noise on output control lines, the dynamic line terminator circuit 1000 of FIG. 10 also serves to reference low-driven control lines to local ground to immunize pass-gate logic from source-to-destination ground differentials caused by IR drops induced by long source-to-destination routing. In other words, any control line routed for distance is routed as a discrete metal line of a given width. The width and thickness of the metal dictate the resistance of the line. For a long control line, e.g. 3000 um or more, the NFET 834, FIG. 8, must maintain a low-level through all the resistance induced on the line. Current flowing on the control line will induce a significant amount of RC delay due to charge encountering the built-in resistance of the conducting metal line. This resistance attenuates NFET 834's ability to maintain a low level at the far end of the line. A voltage swing induced by a control line driver, such as 220, FIG. 2 or 800, FIG. 8, on one end of the control line must propagate the distance of the control line 1002. Thus, the longer the control line, the more susceptible the signal is to noise due to the RC delay. In addition, suppression of a noise spike by distant suppression circuitry will also be subject to the RC delay. By the time the noise spike is suppressed by the suppression circuitry, the voltage on the control line may have exceeded a level corresponding to a threshold voltage of another circuit component coupled to the control line.

In addition, power planes ($V_{DD}$, ground) are routed in similar metal. These metal lines will source ($V_{DD}$) or sink (ground) current as the capacitance of control lines are charged or discharged by output drivers. Ideally, metal planes are tapped to the outside supply fairly often to dissipate or supply charge off the chip. If this is not the case, then on long routes of $V_{DD}$ and/or ground, the resistance of the lines, coupled with the current moving in the metal line, will induce a voltage (V=IR). In the case of $V_{DD}$, if the charge is not supplied by an off-chip source, then the charge is supplied from the intrinsic capacitance of the $V_{DD}$ plane. As charge is removed from the $V_{DD}$ plane, a local lowering or droop in the $V_{DD}$ voltage occurs. In the case of a ground plane, if the charge cannot be dissipated to an off-chip destination, the charge induces an elevated local voltage $V_X$ in the ground plane.

High-speed applications for dynamic logic oftentimes call for the use of NMOS pass-gate logic. If the gate of an NMOS pass gate (NFET) is supposed to be "off" (i.e., at ground), but the local ground plane has an induced differential as described above, then the gate is at some voltage level $V_X$ above ground. Depending on the relationship between $V_X$ and the threshold voltage $V_T$ of the NFET, the ground differential can accidentally fire the NFET (turn it on when it is supposed to stay off) in the case when $V_X >= V_T$, which will drain any precharged nodes prior to the evaluate phase. This results in incorrect computation. Significant levels of $V_X$ relative to $V_T$ can artificially increase the amount of sub-threshold leakage current, inducing anomalous behavior in the dynamic circuit such as decreased noise immunity or a restricted range in the operating frequency. As described above, the dynamic line terminator circuit 1000 shown in FIG. 10 actively suppresses high-going pulses on low control lines, thereby also referencing low-level signals on the control line 1002 to local ground.

As will be appreciated by one skilled in the art, the dynamic line terminator circuit 1000 of FIG. 10 may be used to suppress low-going pulses on high control lines by replacing NFET 1020 with a PFET having a source coupled to a circuit power source.

Figure 11:
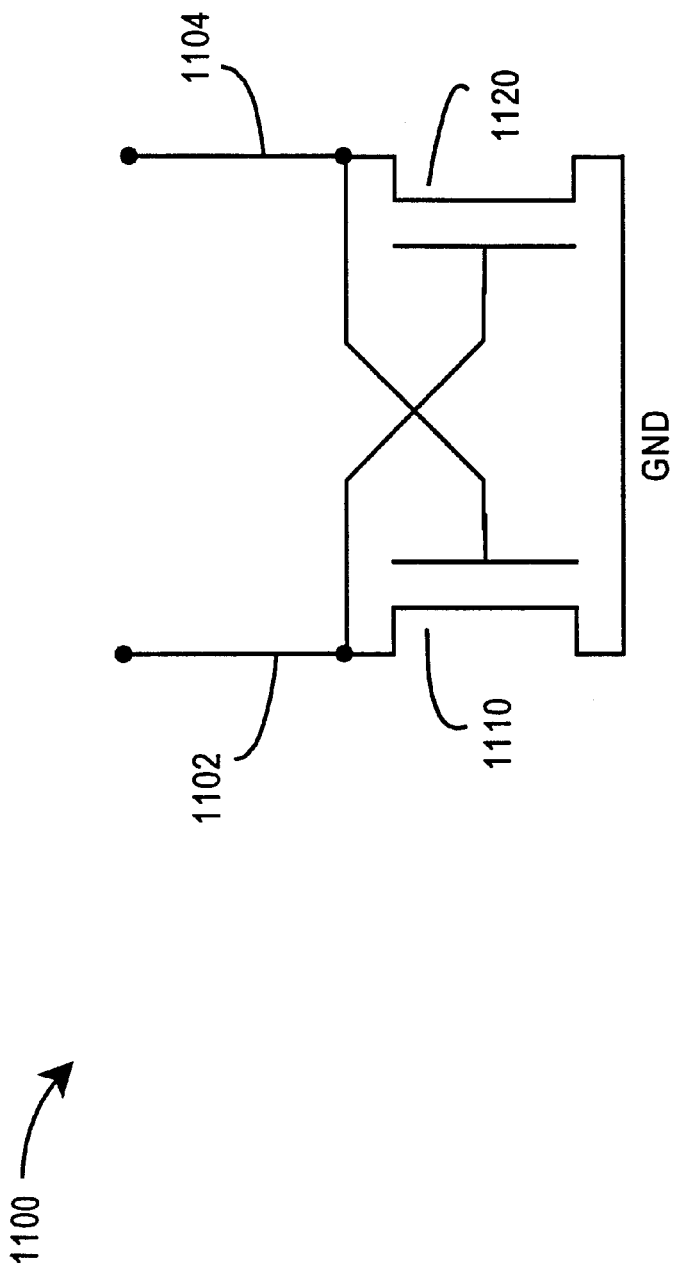
FIG. 11 is a schematic diagram of a noise-suppression circuit for improving noise immunity due to cross-coupling between two mutually exclusive output lines of a dynamic logic circuit.

A final improved noise immunity technique of the present invention is shown in FIG. 11. FIG. 11 shows a noise-suppression circuit 1100 for improving immunity to noise due to cross-coupling between two mutually exclusive output lines of a dynamic logic circuit. As shown in FIG. 11, the noise-suppression circuit 1100 includes a first NFET 1110 and a second NFET 1120 cross-coupled between a first output line 1102 and a second output line 1104. The first output line 1102 and second output line 1104 are mutually exclusive. As shown in FIG. 11, the first NFET 1110 has a drain coupled to the first output line 1102, a source coupled to a circuit ground, and a gate coupled to the second output line 1104. The second NFET 1120 has a drain coupled to the second output line 1104, a source coupled to the integrated circuit ground, and a gate coupled to the first output line 1102.

Improved noise immunity caused by cross-coupling of mutually exclusive output lines results by use of the noise-suppression circuit of the present invention because the cross-coupling of the first and second NFETs 1110 and 1120 actively causes the first and second NFETs 1110 and 1120 to be mutually exclusively on/off. Thus, if first output control line 1102 is high and second output control line 1104 is low, the gate of first NFET 1110 will be low, causing first NFET 1110 to be off, and actively isolating the first output control line 1102 from the low signal level on second output control line 1104. The gate of second NFET 1120 is held high because it is coupled to first output control line 1110. A high level on the gate of second NFET 1120 causes second NFET 1120 to turn on and actively pull the signal level on second output control line 1120 to ground, or low. If the polarity of the signal levels on first and second output control lines 1110 and 1120 are reversed, such that first output control line 1110 is low and second output control line 1120 is high, the operation of first and second NFETs 1110 and 1120 is reversed to provide similar noise immunity.

As will be appreciated by one skilled in the art, the first and second NFETs 1110 and 1120 of the noise suppression circuit 1100 of FIG. 11 may be alternately implemented using PFETS having their sources coupled to a circuit power source.

The above described techniques for improving speed and noise immunity of dynamic logic circuits may be used separately or in conjunction with one another to improve the performance of dynamic logic circuits. While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A high-speed dynamic complementary CMOS inverter for a dynamic logic circuit, said dynamic logic circuit evaluating during an evaluate phase of an arming signal and pre-charging during a pre-charge phase of said arming signal, comprising:

a complementary CMOS inverter having an inverter trigger point tuned to a falling edge of an input signal received at an input node which produces an output signal at an output node, said output signal comprising an inverted version of said input signal and said CMOS inverter comprising:

a PMOSFET having a source coupled to a power source, a gate coupled to the input node, and a drain coupled to the output node; and an NMOSFET having a source coupled to the output node, a gate coupled to the input node, and a drain coupled to a circuit ground;

wherein the ratio of said PMOSFET to said NMOSFET is at least 12 to 1; and a pre-charge assist FET having a drain coupled to the output node and a gate coupled to an arming signal, said pre-charge assist FET operating to assist in pulling said output signal low when said input signal falls past said inverter trigger point and said arming signal enters said pre-charge phase.

2. The high-speed dynamic complementary CMOS inverter of claim 1 wherein the pre-charge assist FET comprises an NMOSFET having a source coupled to the circuit ground.

3. The high-speed dynamic complementary CMOS inverter of claim 1, further comprising a leakage current prevention circuit coupled between said input node and said output node.

4. The high-speed dynamic complementary CMOS inverter of claim 1 wherein:

said complementary CMOS inverter evaluates during said evaluate phase and said precharge assist FET turns on during said pre-charge phase.

5. The high-speed dynamic complementary CMOS inverter of claim 3, wherein said leakage current prevention circuit comprises:

a PMOSFET having a source coupled to the power source, a drain coupled to the input node, and a gate coupled to the output node.

6. A method for increasing the forward path switching speed of a high-speed dynamic complementary CMOS inverter coupled to receive the output of a dynamic logic circuit, said dynamic logic circuit evaluating during an evaluate phase of an arming signal and pre-charging during a pre-charge phase of said arming signal, said CMOS inverter having an inverter trigger point tuned to a falling edge of an input signal received at an input node which produces an output signal at an output node, said output signal comprising an inverted version of said input signal and said CMOS inverter comprising a PMOSFET and an NMOSFET coupled in drain-source relationship with one another, each comprising a drain coupled to said output node, wherein the ratio of said PMOSFET to said NMOSFET is at least 12 to 1, said method comprising:

coupling a drain of a pre-charge assist FET to said inverter output and a gate of said pre-charged assist FET said arming signal, wherein said inverter evaluates during said evaluate phase and said pre-charge assist FET turns on during said pre-charge phase, said pre-charge assist FET operating to assist in pulling said output signal low when said input signal falls past said inverter trigger point and said arming signal enters said pre-charge phase.

* * * * *

UNITED STATES PATENT AND TRADEMARK OFFICE
CERTIFICATE OF CORRECTION

PATENT NO. : 6,069,496
DATED : May 30, 2000
INVENTOR(S) : Paul L. Perez

It is certified that error appears in the above-identified patent and that said Letters Patent is hereby corrected as shown below:

Column 7,
Line 11, delete "$CK_L$" and insert therefor -- $CK_E$' --
Line 36, delete "gate 604" and insert therefor -- gate 630 --

Column 14,
Line 37, after "FET" insert -- to --

Signed and Sealed this

Sixteenth Day of July, 2002

Attest:

JAMES E. ROGAN
Attesting Officer  Director of the United States Patent and Trademark Office